US006387591B1

(12) United States Patent
Leenders et al.

(10) Patent No.: US 6,387,591 B1
(45) Date of Patent: May 14, 2002

(54) HEAT-MODE DRIOGRAPHIC PRINTING PLATE PRECURSOR

(75) Inventors: Luc Leenders, Herentals; Bart Aerts, Rumst, both of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/391,422

(22) Filed: Sep. 8, 1999

Related U.S. Application Data

(60) Provisional application No. 60/112,062, filed on Dec. 14, 1998.

(30) Foreign Application Priority Data

Oct. 15, 1998 (EP) ........................................... 98203497

(51) Int. Cl.[7] .................................................. G03F 7/09

(52) U.S. Cl. ............................... 430/271.1; 430/272.1; 430/303; 101/467

(58) Field of Search .......................... 430/271.1, 272.1, 430/303; 101/467

(56) References Cited

U.S. PATENT DOCUMENTS

| | | | | | |
|---|---|---|---|---|---|
| 3,632,375 | A | * | 1/1972 | Gipe | 117/34 |
| 3,677,178 | A | | 7/1972 | Gipe | |
| 3,869,285 | A | * | 3/1975 | Kondo et al. | 96/1 R |
| 4,016,814 | A | * | 4/1977 | Schank et al. | 101/467 |
| 4,030,416 | A | * | 6/1977 | Schank | 101/450 |
| 4,086,093 | A | * | 4/1978 | Ezumi et al. | 96/86 |
| 5,017,457 | A | * | 5/1991 | Herrmann et al. | 430/272 |
| 5,339,737 | A | * | 8/1994 | Lewis et al. | 101/454 |
| 5,360,781 | A | * | 11/1994 | Leenders et al. | 503/227 |
| 5,379,698 | A | * | 1/1995 | Nowak et al. | 101/454 |
| 5,551,341 | A | * | 9/1996 | Lewis et al. | 101/453 |
| 5,968,709 | A | * | 10/1999 | Verschueren et al. | 430/272.1 |
| 6,022,668 | A | * | 2/2000 | Burberry et al. | 430/302 |
| 6,058,841 | A | * | 5/2000 | Ray et al. | 101/467 |
| 6,093,519 | A | * | 7/2000 | Rompuy et al. | 430/303 |
| 6,130,026 | A | * | 10/2000 | Bennett et al. | 430/303 |

FOREIGN PATENT DOCUMENTS

| | | |
|---|---|---|
| WO | WO 98/50231 | 11/1998 |
| WO | WO 99/16621 | 4/1999 |

OTHER PUBLICATIONS

Derwent Publication XP002104027 and JP 51 008003 A, Toray Ind. Inc., Jan. 22, 1976.

* cited by examiner

*Primary Examiner*—Janet Baxter
*Assistant Examiner*—Barbara Gilmore
(74) *Attorney, Agent, or Firm*—Breiner & Breiner L.L.C.

(57) ABSTRACT

A heat-mode exposable imaging material is disclosed which is suitable for making a driographic printing master capable of accepting ink at exposed areas, said material comprising (i) a first layer containing more than 50% by weight of carbon or of an organic light absorbing compound, and (ii) an ink-abhesive second layer underlying said first layer, characterised in that said first layer is removable at non-exposed areas by starting a pressrun without substantially removing said second layer. In a preferred embodiment, the material comprises a support, a silicone coating and a surface coating which consists essentially of carbon, soot or graphite. After heat-mode exposure, the material is ink accepting at exposed areas and the surface coating is removed at non-exposed areas during the start of a pressrun, thereby revealing the silicone coating.

13 Claims, No Drawings

HEAT-MODE DRIOGRAPHIC PRINTING PLATE PRECURSOR

This application claims the benefit of U.S. Provisional Application No. 60/112,062 filed Dec. 14, 1198.

FIELD OF THE INVENTION

The present invention relates to a heat-mode imaging material which is suitable for making a driographic printing master.

BACKGROUND OF THE INVENTION

Rotary printing presses use a so-called master such as a printing plate which is mounted on a cylinder of the printing press. The master carries an image which is defined by the ink accepting areas of the printing surface and a print is obtained by applying ink to said surface and then transferring the ink from the master onto a substrate, which is typically a paper substrate. In conventional lithographic printing, ink as well as an aqueous fountain solution are fed to the printing surface of the master, which consists of oleophilic (i.e. ink accepting) and hydrophilic (water accepting) areas. In driographic printing, only ink is applied to the printing surface of the master, which consists of ink accepting and ink repelling areas. These ink repelling areas are often called oleophobic or ink-abhesive areas. Driographic plates are sometimes simply called 'dry' plates as distinct from the conventional 'wet' plates.

Printing masters are generally obtained by the so-called computer-to-film method wherein various pre-press steps such as typeface selection, scanning, colour separation, screening, trapping, layout and imposition are accomplished digitally and each colour selection is transferred to graphic arts film using an image-setter. After processing, the film can be used as a mask for the exposure of an imaging material called plate precursor and after plate processing, a printing plate is obtained which can be used as a master.

In recent years the so-called computer-to-plate method has gained a lot of interest. This method, also called direct-to-plate method, bypasses the creation of film because the digital document is transferred directly to a plate precursor by means of a so-called plate-setter. A special type of a computer-to-plate process, involves the exposure of a plate precursor while being mounted on a plate cylinder of a printing press by means of an image-setter that is integrated in the press. This method may be called 'computer-to-press' and printing presses with an integrated image-setter are sometimes called digital presses. A review of digital presses is given in the Proceedings of the Imaging Science & Technology's 1997 International Conference on Digital Printing Technologies (Non-Impact Printing 13).

The computer-to-press methods referred to above preferably use so-called thermal or heat-mode imaging materials, i.e. plate precursors or on-press coatable compositions which comprise a compound that converts absorbed light into heat, which then triggers the imaging mechanism of the plate precursor. Thermal plates offer the potential advantages of daylight handling and elimination of processing after exposure. The best known heat-mode driographic materials are based on ablation such as the plates disclosed in e.g. EP-A 580 393; EP-A 684 133; U.S. Pat. No. 5,540,150; U.S. Pat. No. 5,551,341; and U.S. Pat. No. 5,379,698.

All these plates work according to a similar mechanism ablative absorption of a recording layer provokes the removal of an ink-abhesive surface layer to reveal an underlying ink accepting surface. The recording layer is typically a thin metal layer, which is melted or vaporised upon exposure. Silicone coatings are generally used as an ink-abhesive top layer. Several problems are associated with ablative dry plates as described above, especially when used in computer-to-press methods:

(i) The redeposited debris of the top layer is difficult to remove because the silicones are cross-linked to achieve a wear resistant surface layer enabling long press runs. A complete removal of silicone in printing areas is however necessary to obtain high quality prints. Actually, the requirements of wear resistance and easy removal are contradictive and therefore difficult to realise.

(ii) The debris generated upon exposure may disturb the printing process or may contaminate the exposure optics of the integrated image-setter. This problems is to some extent solved by "semi-ablative" plates wherein only the anchorage between the ink-abhesive top layer and the recording layer is disrupted upon exposure instead of complete ablation of the layers. However, such materials still contain a removable silicone top layer and require a mechanical processing step using a special cleaning liquid that comprises a silicone solvent, as described in EP-A 830 942.

(iii) The known driographic thermal materials are suitable for exposure with either an internal drum image-setter (i.e. typically a high-power short-time laser exposure) or an external drum image-setter (i.e. relatively low-power long-time laser exposure). Providing a universal material that can be exposed with satisfactory results on both these types of devices known in the graphic arts is a requirement difficult to fulfil.

Turning in particular to EP-A 580 393, this patent application claims a lithographic printing plate directly imageable by laser discharge, the plate comprising a topmost first layer and a second layer underlying the first layer, wherein the first layer is characterised by efficient absorption of infrared radiation and the first and second layer exhibit different affinities for at least one printing liquid selected from the group consisting of ink and an abhesive fluid for ink. In spite of the broad claim covering both wet and dry plates, this patent application only enables the making of a driographic plate wherein a silicon layer is removed by ablative absorption and cleaning. Accordingly, the driographic plates disclosed by EP-A 580 393 are characterised by the same disadvantages as described above.

WO99/16621 describes a method for making a driographic plate wherein an ink-abhesive support is coated with an ink-accepting formulation which preferably comprises less than 25 wt. % of light absorbing compound.

SUMMARY OF THE INVENTION

It is an object of the present invention to provide a heat-mode imaging material which is suitable for making a driographic printing master and is not based on removal of a silicone layer so that the problems associated therewith, as described above, do not occur. It is another object of the present invention to provide materials which require no processing or are processed by the printing process itself. It is still another object of the present invention to provide a universal material which can be exposed with internal as well as external drum image-setters. The above objects are realised by the material specified in claim 1. Preferred embodiments of the material of the present invention are specified in the dependent claims.

It is another object of the present invention to provide a method for making a driographic printing master characterised by the above advantages. This object is realised by the method which is specified in claims 6 and 7 with preferred embodiments thereof being specified in the dependent claims.

Further advantages and embodiments of the present invention will become apparent from the following description.

DETAILED DESCRIPTION OF THE INVENTION

The features of the present invention, as specified in the claims, are defined herein as follows. The term "image" is used in the context of driographic printing, i.e. a pattern consisting of ink accepting and ink-abhesive areas. The material of the present invention is negative working, meaning that the areas, which have been exposed to light, are ink accepting and that the non-exposed areas are ink-abhesive. The material is a "heat-mode" material, meaning that the imaging mechanism is triggered by heat, which is generated upon exposure to light by the presence of a light absorbing compound. The material of the present invention can be used as a driographic printing master directly after exposure without a processing step, because the material comprises a light absorbing layer, defined as the "first layer", which can be removed at the non-exposed areas by starting a pressrun. The removal of said first layer reveals an underlying layer having an ink-abhesive surface, said layer being defined as the "second layer". No material of the second layer needs to be removed during the heat-mode exposure or during the start of the pressrun, so that the second layer can be made highly wear-resistant, enabling long press runs.

The imaging mechanism of the materials according to the present invention is not known, but seems to result in a conversion of the surface of the material into an ink accepting phase which cannot be removed by printing, i.e. which is resistant to mechanical cleaning and is insoluble in ink. Though partial ablation of the first layer may occur during heat-mode exposure, a significant amount of the light absorbing compound is not removed by the exposure but seems to be converted into an ink accepting substance which defines a printing area on the plate. This conversion can be a chemical reaction of the light absorbing compound itself but also other compounds present in the material can be involved. In some embodiments, the light absorbing compound may only act as a light-to-heat convertor which triggers the conversion of another compound into an ink accepting phase. Said other compound may be present in the first or the second layer.

A preferred material according to the present invention comprises a support and provided thereon a silicone coating as a second layer and a carbon-based top layer as a first layer. Other suitable embodiments will now be discussed in detail.

The ink-abhesive second layer can be a self-supporting layer which acts as a support of the first layer. More preferably, the first and second layer are carried by a support. Since said support is not utilised as a printing surface, its affinity for ink is not relevant. The support can be opaque or transparent, the latter enabling back-side exposure. A preferred support is a plastic foil or a metal support. Suitable examples of such a plastic foil are cellulose esters such as cellulose acetate, cellulose propionate and cellulose butyrate, polyesters such as poly(ethylene terephthalate) and poly(ethylene naphtalenecarboxylate), poly(vinyl acetals), polystyrene, polycarbonate, poly(vinyl chloride) or poly-alpha-olefins such as polyethylene or polypropylene. Preferred examples of a metal support are steel, particularly polished stainless steel, and especially aluminium. In a highly preferred embodiment, the support can also be the surface of a press cylinder, an endless belt or a metal sleeve which may be mounted on a press cylinder before or after being applied with the first and second layer.

The second layer contains an ink-abhesive compound, e.g. a fluoropolymer or, more preferably, a silicone. In a preferred embodiment, the second layer is a silicone coating which contains one or more components one of which is generally a linear silicone polymer terminated with a chemically reactive group at both ends and a multifunctional component as a hardening agent. The silicone coating is preferably crosslinked, e.g. by condensation curing, addition curing or radiation curing.

Condensation curing can be performed by using a hydroxy-terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si-H to a double bond in the presence of a platinum catalyst. Silicone coatings that can be cured according to the addition curing thus comprise a vinyl group containing polymer, a platinum catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation curable coatings that can be used in accordance with the present invention are e.g. U.V. curable or electron beam curable polysiloxane polymers. The latter coatings preferably contain multifunctional (meth)acrylate monomers.

The second layer may also comprise other ingredients, e.g. plasticisers, pigments, dyes, etc. One or more intermediate layers may be present between the first and the second layer, provided that these layers can be removed during the pressrun or optional processing steps. One or more intermediate layers may also be present between the second layer and the support, e.g. a layer which promotes the adhesion of the second layer to the support or which reflects incident light back to the first layer. On top of the first layer there may be provided a surface layer for protecting said first layer against moisture, chemicals, oxygen, mechanical impact, etc.

The first layer which comprises the light absorbing compound is preferably very thin, i.e. having a dry layer thickness below 1 $\mu$m, preferably below 0.5 $\mu$m and even more preferably below 0.1 $\mu$m. A layer thickness of 0.01 $\mu$m may still give satisfactory results.

The light absorbing compound used in the present invention is a compound which is capable of converting light into heat and is preferably carbon-based or organic. A near infrared light absorbing compound is preferred. Useful compounds are for example organic dyes, carbon black, graphite or soot. It is also possible to use a light absorbing polymer dispersion such as a polypyrrole, polyethylenedioxythiophene or polyaniline-based polymer dispersions. The first layer comprises the light absorbing compound as main compound, i.e. in an amount not less than 50% by weight. In even more preferred embodiments, said amount of light absorbing compound in the first layer is not less than 70% or even not less than 90% by weight. In a most preferred embodiment, the first layer consists essentially of light absorbing compound.

The first layer of the present invention may contain a binder e.g. gelatine, cellulose, cellulose esters e.g. cellulose acetate, nitro-cellulose, poly(vinyl alcohol), poly(vinyl pyrrolidone), a copolymer of vinylidene chloride and acrylonitrile, poly(meth)acrylates, or poly(vinyl chloride). The first layer may further comprise additional inert compounds such as a pigment, a matting agent, a filler, wetting agents or anti-oxidising agents. The word "inert" shall not be understood in the meaning of "non-functional", since such inert compounds may be added to the layer to adjust certain physical properties, such as e.g. the surface roughness or the friction coefficient of the applied layer. The word "inert" shall rather be understood as meaning "not essential for the imaging process", though some inert compounds may have a (minor) influence on the speed and image quality of the material.

Though the first layer may comprise other compounds in addition to the light absorbing compound, the amount of other reactive compounds besides the light absorbing compound is preferably less than 20% by weight. The feature "reactive compound" shall be understood as a compound which undergoes a (physico-)chemical reaction due to the heat generated during image-wise exposure. Examples of such reactive compounds are thermoplastic polymer latex, diazo resins, naphtoquinone diazide, photopolymers, resole and novolac resins, or modified poly(vinyl butyral) binders. More examples can be found in J. Prakt. Chem. Vol. 336 (1994), p. 377–389.

More preferably the amount of said other reactive compounds in the first layer is less than 10% by weight and most preferably, the first layer is substantially free from reactive compounds other than the light absorbing compound. The words "substantially free" shall be understood as meaning that a small ineffective amount of such reactive compounds may be present in addition to the light absorbing compound. Said small ineffective amount is not essential for or does not significantly contribute to the imaging process of the material made according to the present invention. This can be tested easily by preparing a material without said small amount of reactive compounds and establishing whether the material thus obtained can still be used to make a printing master. The treshold value below which the amount of the other reactive compounds, besides the light absorbing compound, may be regarded as "ineffective" depends on the nature of the reactive compounds.

The first layer can be applied by coating a solution or dispersion of the light absorbing compound using the known coating techniques. Coating of a dispersion of carbon or a solution of an organic dye, or mixtures thereof, are highly preferred embodiments of the method according to the present invention. Jet methods can be used as an alternative coating technique, whereby either a uniform layer of light absorbing compound is jet-coated on the second layer and then image-wise exposed or whereby the light absorbing compound is image-wise applied on the second layer and then rendered ink accepting by intense heating, e.g. by infrared laser exposure.

The first layer can also be applied as a dry powder of which the light absorbing compound is the main compound, i.e. present in an amount not less than 50% by weight. In a preferred embodiment of the present invention the dry powder consists of or comprises soot as a light absorbing compound, i.e. the black carbon obtained from the incomplete combustion of organic materials such as oils, wood, natural gas, butane, acetylene, coal, wax or cork. Said soot may even be applied by contacting the support which carries the second layer with a flame obtained by burning said organic material, preferably with the colder part of the flame where combustion is incomplete, e.g. the yellow end of a candle flame. Electron microscopic images of materials made in this way show a coating of submicron soot particles.

A preferred method for applying the first layer is rubbing in the support, which carries the second layer, with a dry powder comprising the light absorbing compound, e.g. carbon or an organic dye in powder form, or even with incompletely burned organic materials such as charcoal, a semi-burned cork, etc. Alternative dry coating methods can also be used, e.g. sputter-coating of carbon or direct electrostatic printing (toner jet). The latter technique can also be used to apply the dry powder image-wise and after intense heating, e.g. by infrared laser exposure, a printing master is obtained. Said infrared laser can be mounted on the same carriage as the direct electrostatic printing head.

Depending on the thickness of the first layer and on the method used for applying the first layer, said first layer may be a contiguous or a non-contiguous layer. Especially when a thin layer of soot is deposited by incomplete combustion, electron microscopic images reveal that on a submicron scale some areas are not covered by the soot particles. It shall be understood that the feature "first layer" also embraces a non-contiguous layer, irrespective of the scale of the non-covered areas, which may be even macroscopic, e.g. in the case of image-wise application of a first layer as discussed above.

The method of the present invention can be used in computer-to-plate (off-press exposure) or computer-to-press (on-press exposure) procedures. The method may also involve on-press coating, e.g. applying a first layer according to the present invention on a second layer which is carried by a support mounted on a cylinder of the printing press. Said on-press coating may also be carried out directly on the cylinder of a printing press, said cylinder acting as a support.

The first layer can also be applied by using a transfer material, which comprises a support and a transfer layer containing a light absorbing compound. A preferred method comprises the step of contacting the second layer with the transfer layer, preferably while applying heat and/or pressure, thereby carrying over at least part of the transfer layer to form a first layer according to the present invention.

The method of the latter embodiment can be automated easily, e.g. by incorporating a supply roll of such a transfer material, such as a ribbon impregnated with light absorbing compound, in a print station of a digital press similar to the configuration which is described in EP-A 698 488. The transfer material can be unwound from said supply roll and the layer containing the light absorbing compound can then be brought in direct contact with the surface of a plate cylinder or a support mounted on said plate cylinder by one or more contact rollers. After the transfer step, the used transfer material may be wound up again on a take-up roll. In the latter embodiment, the transfer can be carried out so as to obtain a uniform layer which then can be image-wise exposed. Alternatively, pressure and/or heat can be applied image-wise during the transfer step, so that the first layer is applied in a patterned form. This step then may be followed by intense heating, e.g. by infrared laser exposure. However, if sufficient heat is applied during said image-wise transfer, a suitable printing master may be obtained directly without intense heating.

The materials of the present invention can be exposed to light by a light emitting diode or a laser such as a He/Ne or Ar laser. Preferably a laser emitting near infrared light having a wavelength in the range from about 700 to about 1500 nm is used, e.g. a semiconductor laser diode, a Nd:YAG or a Nd:YLF laser. The required laser power depends on the pixel dwell time of the laser beam, which is determined by the spot diameter (typical value of modern plate-setters at $1/e^2$ of maximum intensity:10–25 μm), the scan speed and the resolution of the exposure device (i.e. the number of addressable pixels per unit of linear distance, often expressed in dots per inch or dpi; typical value:1000–4000 dpi). A major benefit of the materials of the present invention is that they can be used as a universal imaging material which is suitable for exposure by internal (ITD) as well as external drum (XTD) image-setters. ITD image-setters are typically characterised by a very high scan speed up to 500 m/sec and may require a laser power of several Watts. Satisfactory results have also been obtained by using XTD image-setters having a typical laser power from about 200 mW to about 1 W at a lower scan speed, e.g. from 0.1 to 10 m/sec.

The non-exposed areas of the first layer can be removed by starting a pressrun, e.g. due to the mechanical friction between the plate and a contacting cylinder or due to dissolution of the first layer in the ink applied onto the plate. Typically the non-exposed layer is removed during the first few runs of the printing job. When the first layer comprises a pigment or dye which absorbs visible light, its removal may be observed as a fog present in the non-printing areas of the first printed copies. Optionally, e.g. when a lower number of fogged copies is preferred, the material can also be rubbed before printing, e.g. with a dry cloth, a cotton pad or a rotating brush. One can also use a cloth which is moistened with plain water or a non-solvent, i.e. a liquid which is not capable of excessively solubilising the second layer, e.g. alcohols such as ethanol, n-propanol, isopropanol or butanol. Alkanes such as heptane or iso-octane can also be used with the proviso that their use may not result in an excessive solubilisation of the second layer, which can be prevented by using a highly crosslinked layer, e.g. a cured silicone coating. Said optional processing step may be performed on-press, i.e. after mounting the exposed plate on the plate cylinder of a printing press.

EXAMPLES

While the present invention will hereinafter be described in connection with preferred embodiments thereof, it will be understood that it is not intended to limit the invention to those embodiments.

Example 1–2

A PET support was coated with a layer comprising poly(vinyl alcohol), hardened with tetramethoxysilane, and titanium dioxide. On top of this layer was coated a mixture of 12.5 g of silicone Dehesive 520, 1 g of Vernetzer V03 and 0.5 g of Katalysator C09, all trade names of Wacker-Chemie GmbH (Munich, Germany), to obtain a second layer having a dry thickness of 10 μm (Example 1). Silicone Dehesive 520 has an average molecular weight of about 5000. In Example 2, the latter coating composition was diluted 4-fold with iso-octane and coated on a similar support as in Example 1, to obtain a second layer having a dry thickness of 2.5 μm. Both samples were cured at 90° C. during 40 seconds and then rubbed in with a semi-burned cork. The layer thus obtained was tamped with a cotton pad so as to obtain relatively homogenous first layer of soot.

A test pattern was exposed in heat-mode using an XTD Nd:YAG image-setter (spot-size at $1/e^2$:23 μm) at a scan speed of 1 and 2 m/sec and a power of 350, 400 and 450 mW (six different exposures at distinct areas of each sample). The image pattern was visible immediately after exposure. The samples were then processed by rubbing with a cotton pad that was moistened with water. The samples were mounted on an AB Dick 9860 printing press and a pressrun of 100 copies was started using Reflecta Dry Magenta ink, trade name of Hostmann-Steinberg (Celle, Germany), without using a fountain. The exposed areas of the samples were ink accepting, indicating that the soot layer was not completely ablated but converted into an ink accepting substance.

Example 3–4

50 g of silicone Dehesive 520, 2 g of Vernetzer V03 and 1 g of Katalysator C09, as defined in Example 1, were mixed, coated on a similar support as used in Example 1 to obtain a second layer having a dry thickness of 2 $g/m^2$ and then cured during 40 seconds at 90° C. In Example 3, a first layer of graphite was applied on the above second layer by rubbing in graphite powder consisting of "Graphite Naturel" (particle size <20 μm), trade name of Carbone Lorraine, with a cotton pad. In Example 4, "Graphite Artificiel" having a particle size <56 μm was used.

The samples were exposed with an ITD image-setter, type Crescent 42T of Gerber, USA, at a scan speed of 367 m/sec, a spot size of 24 μm and a power of 4.25, 5.25 and 6.25 W (three different exposures at distinct areas of each sample). An image was clearly visible immediately after exposure. One part of each sample was processed by rubbing with a cotton pad moistened with water (parts 3A and 4A), a second part with a cotton pad moistened with iso-octane (parts 3B and 4B) and a third part was not processed at all (parts 3C and 4C). The soot layer was completely removed in parts 3A, 3B, 4A and 4B.

A pressrun was started on a GTO 52 press, available from Heidelberg, Germany, using Reflecta Dry Magenta ink, defined above, and no fountain. A clear image was printed with parts 3C and 4C.

Example 5

In Example 5, the same silicone composition as used in Examples 3 and 4 was coated on an aluminium support and the second layer thus obtained was then covered with a soot layer by moving said second layer in the yellow end of a flame fed with butane. This sample was exposed using the same ITD image-setter as in Examples 3 and 4 at a power of 6.25 W. A first part of the sample was processed by rubbing with a cotton pad moistened with iso-octane (part 5A), a second part was rubbed with a dry cotton pad (part 5B), a third part was not processed at all (part 5C) and a fourth part was rubbed with a cotton pad moistened with "Reinigungskonzentrat 1124", trade name of Heidelberg (Germany), and then with a cotton pad moistened with iso-octane (part 5D). A similar pressrun as in Examples 3–4 was started. Parts 5A and 5C provided a suitable printed image.

Example 6–7

The same samples as in Examples 3 and 4 were exposed using an XTD Nd:YAG image-setter at a scan speed of 3.2 m/sec, a spot size of 23 μm, and a power of 263 and 292 mW (two different exposures at distinct areas of each sample). The samples were first rubbed with a cotton pad which was moistened with "Reinigungskonzentrat 1124", defined above, and subsequently with a cotton pad moistened with water. Because not all the graphite could be removed in this way, the samples were additionally processed by rubbing with a cotton pad moistened with iso-octane. A faint, gray image was visible at the exposed areas, which looked like a roughened phase compared to the unexposed areas. A similar pressrun was started as described in Examples 3 and 4. Good prints were obtained with both samples. A faint fog disappeared completely after printing 25 copies.

Example 8–9

The same sample as in Example 5 was exposed using an XTD 830 nm laser diode with a scan speed of 3.2 m/sec, a spot size of 11 μm and a power of 220 and 292 mW (two different exposures at distinct areas of sample 8) or an XTD Nd:YAG image-setter with a scan speed of 3.2 m/sec, a pixel size of 23 μm and a power of 751 and 1040 mW (also two different exposures at distinct areas of sample 9). Each sample was processed in four different ways at distinct parts as given below (all liquids were applied by rubbing with a cotton pad)

parts 8A and 9A: iso-octane;

parts 8B and 9B: first iso-octane, then rubbed with a dry cotton pad until all soot was removed;

parts 8C and 9C: no processing;

parts 8D and 9D: first "Reinigungskonzentrat 1124, defined above, then iso-octane.

Each sample was used as a printing plate in a GTO 46 printing press, available from Heidelberg (Germany), using Reflecta Dry Magenta ink, defined above, and no fountain. Only parts 8A, 9A, 8C and 9C provided good copies.

Example 10

The same support provided with silicone coating as in Examples 3–4 was rubbed in with a fine powder of the infrared dye having the following formula:

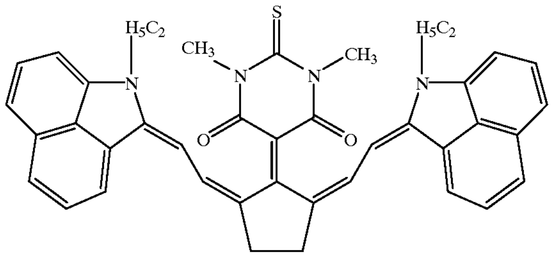

The dye layer thus obtained was then tamped with a cotton pad. The material could be image-wise exposed with an XTD 830 nm laser diode with a scan speed of 3.2 m/sec, a spot size of 11 μm and a power from 150 to 300 mW as well as with an XTD Nd:YAG image-setter with a scan speed of 3.2 m/sec, a pixel size of 23 μm and a power of 550 to 975 mW mW. One part of the plate was rubbed with a cloth moistened with iso-octane, another part was not processed at all. Using the same press conditions as indicated in Examples 3–4, good copies were obtained on the non-processed part. The part which was rubbed with iso-octane did not show an image on the plate, nor on the printed copies.

Having described in detail preferred embodiments of the current invention, it will now be apparent to those skilled in the art that numerous modifications can be made therein without departing from the scope of the invention as defined in the appending claims.

What is claimed is:

1. A heat-mode exposable imaging material which is suitable for making a driographic printing master, said material comprising (i) a first layer which is capable of accepting ink at exposed areas and which contains more than 50% by weight of carbon or of an organic light absorbing compound; and (ii) an ink-abhesive second layer underlying said first layer;

wherein the first layer is removable at non-exposed areas by starting a pressrun or by an optional processing step without removing the second layer.

2. A material according to claim 1 wherein the first layer comprises less than 20% by weight of other reactive compounds besides the light absorbing compound.

3. A material according to claim 1 or 2 wherein the first layer consists essentially of carbon, soot or graphite.

4. A material according to claim 1 or 2 wherein the second layer comprises a crosslinked silicone compound.

5. A material according to claim 1 or 2 wherein the first and second layer are carried by a support.

6. A material according to claim 5 wherein the support is a cylinder of a printing press or a metal sleeve.

7. A method for making a driographic printing master, said method comprising the steps of (i) applying a first layer on an ink-abhesive second layer, said first layer containing more than 50% by weight of carbon or of an organic light absorbing compound;

(ii) image-wise exposing said first layer in heat-mode;

(iii) removing said first layer at non-exposed areas by starting a pressrun or by an optional processing step without removing said second layer;

wherein the first layer is capable of accepting ink at exposed areas.

8. A method for making a driographic printing master, said method comprising the steps of (i) image-wise applying a first layer on an ink-abhesive second layer, said first layer containing more than 50% by weight of carbon or of an organic light absorbing compound;

(ii) heating said first layer;

wherein the heated first layer is capable of accepting ink.

9. A method according to claim 7 or 8 wherein the first layer is applied as a dry powder.

10. A method according to claim 7 or 8 wherein the first layer is deposited by incomplete combustion of organic material.

11. A method according to claim 7 or 8 wherein the first layer is applied by using a transfer material, said transfer material comprising a support and a transfer layer containing a light absorbing compound.

12. A method according to any of claims 7 or 8 wherein the first and second layer are carried by a support and at least one step is carried out while said support is mounted on a cylinder of a printing press.

13. A method according to any of claims 7 or 8 wherein the first and second layer are carried by a cylinder of a printing press.

* * * * *